United States Patent
Pflueger et al.

[11] Patent Number: 6,033,175
[45] Date of Patent: Mar. 7, 2000

[54] DOCKING MECHANISM FOR ALIGNING, COUPLING AND SECURING A MOVABLE CART TO A STATIONARY WORKSTATION

[75] Inventors: John C. Pflueger; Lawrence R. Gravell, both of Austin, Tex.

[73] Assignee: Jenoptik Aktiengesellschaft, Jena, Germany

[21] Appl. No.: 09/170,557

[22] Filed: Oct. 13, 1998

[51] Int. Cl.[7] .................................................. B60P 1/64
[52] U.S. Cl. ...................... 414/401; 414/396; 414/584; 414/940
[58] Field of Search .................... 414/401, 396, 414/584, 940

[56] References Cited

U.S. PATENT DOCUMENTS

| | | | |
|---|---|---|---|
| 3,869,052 | 3/1975 | Leahy ........................................ | 414/401 |
| 4,029,221 | 6/1977 | Nakai et al. ............................. | 414/401 |
| 4,363,587 | 12/1982 | Rooklyn .................................. | 414/401 |
| 4,494,905 | 1/1985 | Yamaji et al. ........................... | 414/584 |
| 4,671,728 | 6/1987 | Clark et al. .............................. | 414/401 |
| 5,144,369 | 9/1992 | Benedict et al. ..................... | 414/401 X |
| 5,387,063 | 2/1995 | Napierkowski et al. ........... | 414/401 X |
| 5,655,869 | 8/1997 | Scheler et al. ....................... | 414/401 X |
| 5,695,315 | 12/1997 | Doi ...................................... | 414/401 X |

*Primary Examiner*—Robert P. Olszewski
*Assistant Examiner*—Gerald O'Connor
*Attorney, Agent, or Firm*—McAulay Nissen Goldberg Kiel & Hand, LLP

[57] ABSTRACT

A device that aligns and couples a movable object to a destination includes fixed and movable coupling elements that interengage with one another. The fixed coupling elements are provided in a fixed location at the destination and the movable coupling elements are provided on the movable object. The fixed coupling elements include a guiding device and a mechanism that fixes an ultimate coupling position of the object. The fixing mechanism is included in the guiding device. The guiding device allows movement of the object in a first direction so that it can reach the ultimate coupling position, which is determined by the fixing mechanism. The guiding device further blocks movement of the object in a direction perpendicular to the first direction. The movable coupling elements are separated into first elements that engage in the guiding device and second elements that engage with the fixing mechanism. The device further generates first status signals on the state of the coupling of the movable object to the destination and the mechanism that generates the first status signals is included in the second elements.

11 Claims, 6 Drawing Sheets

DOCKING MECHANISM FOR ALIGNING, COUPLING AND SECURING A MOVABLE CART TO A STATIONARY WORKSTATION

BACKGROUND OF THE INVENTION a) Field of the Invention

The invention is directed to a device for aligning and coupling at least a partial region of a movable object to a destination, with interengaging fixed and movable coupling elements.

Such devices can be used, inter alia, for transport vehicles in semiconductor fabricating plants and by manufacturers for fitting out such fabricating plants, on which vehicles mechanisms for the highly accurate, reproducible and reliable transfer of items between the vehicle and the destination are installed.

The items may be, for example, transport containers for material transport; the destinations may be processing stations or depositing locations spatially removed from one another.

b) Description of the Related Art

In semiconductor fabricating plants, it is customary to transport the substrates to be processed in open or closed containers between different locations and different processing devices by transport devices specially designed for the purpose. In such cases, the handling of the containers during the required loading and unloading operations is to take place in an ergonomic way for the operating personnel. The latter is of special significance with the increasing size of substrates to be processed and the associated increase in size and weight of the containers.

Known simple transport vehicles have storage capabilities for the containers and require loading and unloading by the operating personnel. A solution which is as simple as possible is important particularly whenever a transport system has to be used as an interim solution for an automatic system, because the containers to be transported exceed the ergonomically admissible limit. Specifically in the early and medium-term construction phase of semiconductor fabricating plants, manually operated transport systems are required in order to optimize fitting out and work procedures. However, such interim solutions usually rule out fully automatic systems with complicated and expensive electronics and sensor systems, for reasons of cost. When such a transport vehicle has reached its destination, its adequately accurate positioning and fixing at the destination is required with respect to the loading and unloading station.

A known device according to U.S. Pat. No. 5,655,869 serves the purpose of coupling specially designed robot equipment to permanent fixtures. The device includes a mobile enclosure, which has aligning and holding elements for fastening on a coupling element aligned with respect to the permanent fixture. The coupling element is an adjustable bottom plate with a beveled front edge, in which semispherical-cap supporting screws are deposited in shaped elements for positive-locking orientation in accordance with coordinates. For fastening, a permanent magnet with reversible force is fitted in the enclosure. With such a device, a stable adjustment to the set coordinates is possible with respect to the permanent fixture. It is expressly provided that only for service purposes is the device to be removed from the permanent fixture and reproducibly brought back into place.

It is disadvantageous that the means for aligning and fixing allow only a single position at the destination. In this respect, the device is not suitable for a carriage in constant transport, owing to its inadequate flexibility. Restrictions, such as a relatively small available space, the location of which has to be predetermined, cause additional problems for the coupling elements.

In U.S. Application Ser. No. 08/979,522 there has already been described a manually guided vehicle which can be aligned and fixed in a number of positions with respect to a destination. Once the coupling state has been established for a position, a mechanism assigned to this position, with which a transfer of the containers takes place, is put into operation by the operating personnel. Since the status of the coupling and the operation of the mechanism are dependent on each other, it is desirable for reasons of reliability, safety and value of the work product if the operating personnel are prevented from taking operating steps which disturb the relationship between the status of the coupling and the operation of the mechanism.

OBJECT AND SUMMARY OF THE INVENTION

The primary object of the invention is to eliminate to a great extent operating errors in the alignment and coupling of a movable object to a destination and in the operating of mechanisms which are present on the movable object and the operation of which is associated with the status of the coupling.

According to the invention, the object is achieved by a device for aligning and coupling at least a partial region of a movable object to a destination, with interengaging fixed and movable coupling elements.

While the fixed coupling elements are provided in the form of a coupling interface in a fixed location at the destination, all the movable coupling elements, which determine the ultimate coupling position, are on the object. The following advantages are achieved as a result. On account of the considerably higher number of coupling interfaces within a factory with respect to movable objects in the form of vehicles, the manufacturing costs of the overall facility are reduced. A further considerable advantage results from the movable coupling elements fitted on the vehicle, by virtue of the fact that status signals which characterize the state of the coupling of at least a partial region of the movable object at the destination can be generated. Such status signals are significant for controlling the operation of at least one mechanism on the vehicle for the transfer of items between the object and the destination, the operation of which mechanism is associated with the state of the coupling.

The fixed coupling elements include a guiding device and means for fixing at least one ultimate coupling position, the guiding device allowing a movement of the object in a first direction for reaching the ultimate coupling position and blocking a movement perpendicularly with respect to this direction. The movable coupling elements are separated into first elements for engagement in the guiding device and second elements for engagement with the means for fixing at least one ultimate coupling position, the second elements including means for generating first status signals on the state of the coupling of at least a partial region of the movable object to the destination. The second elements further include means for generating a detent force which provides feedback to an operator that the object is located in the ultimate coupling position.

The means for generating first status signals advantageously include at least a first rotatable shaft with markings for angular positions of the shaft differing from one another, in the coupled state and uncoupled state. Sensing elements serve for detecting the markings, and pass the sensed angular position on to a device for signal transmission as the first status signal.

In one configuration, two mechanisms for the transfer of an item are provided on the vehicle, each of which mechanisms is assigned a means for generating first status signals, the generated status signals of each means differing from one another. The device for signal transmission is in connection with a receiver on a control device, in which the transmitted status signal allows a transmission of a drive power to the assigned mechanism or prevents a power transmission.

It is a further advantage of the invention that the movable coupling elements can be blocked in the presence of an external signal, generated for example by a mechanism for the transfer of items, in order in this way to prevent the object from being moved away from the destination.

For this purpose, the second elements include as means for preventing and enabling the moving away of the object from the destination an immobilizer with a receiving device for second status signals on the operating state of the at least one mechanism. The immobilizer controlled by the second status signals has on the first shaft a blocking wheel, on which there rests, with the force of a spring, a locking roller which is rotatably fastened to a locking lever. During blocking, the locking lever assumes an arrested state.

Furthermore it is advantageous if the first elements for engagement in the guiding device include at least a second rotatable shaft with a pair of rollers at their end facing the guiding device, the rollers of which enclose the second rotatable shaft between them and have axes of rotation directed perpendicularly with respect to the shaft axis. The engagement is associated with a linear movement, directed at the guiding device, and a subsequent rotational movement of the second rotatable shaft, so that subsequently one roller of the pair of rollers is guided in the guiding device.

The means for fixing at least one ultimate coupling position comprise a coupling bolt, which can be fixed in an adjusted manner along the guiding device and around which a coupling region, fastened to the end region of the first rotatable shaft, places itself with a notch during coupling by rotation of the shaft. This results in an angular position of the first shaft which is different from the uncoupled state.

The present invention allows a highly accurate and reproducible coupling of a vehicle to a destination and the detection of different coupling positions. Destinations may be loading and unloading stations or other locations within the effective range of the vehicle, where a transfer or a takeover of items or material is to take place.

A two-way signal transmission of electronic or mechanical signals between the movable coupling elements and the transfer mechanisms has the effect that a transfer mechanism is only put into operation when the establishment of the coupling state has been completed. In addition, the discontinuation of the coupling state is dependent on the transfer mechanism being taken out of operation. If a transfer mechanism is in operation, the vehicle is prevented from leaving the destination, since the discontinuation of the coupling state is dependent on the transfer mechanisms being taken out of operation.

The invention is explained more fully with reference to the drawings.

DESCRIPTION OF THE PREFERRED EMBODIMENTS

Figure 1:
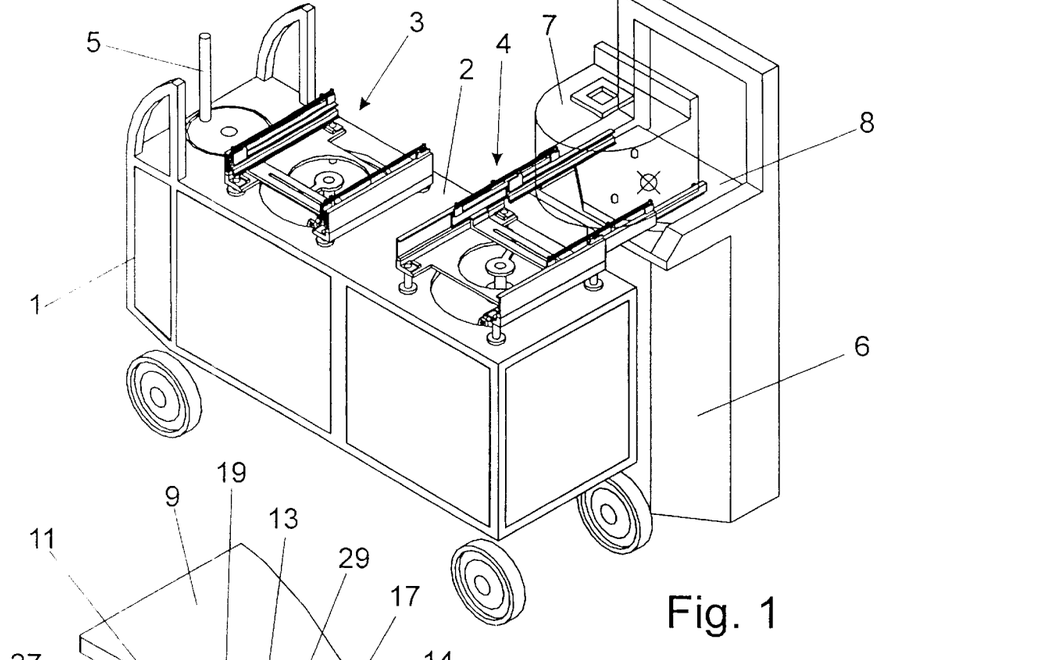
FIG. 1 shows a movable object in the form of a vehicle in a simplified representation.

The movable object represented in FIG. 1 in the form of a vehicle includes on a mobile frame 1 a plate 2 with two transfer mechanisms 3, 4 and a drive element 5. Of course, it is also possible to use a vehicle with only one transfer mechanism. The drive element 5 is in the present exemplary embodiment a simple hand crank, but may also be replaced by another suitable element for supplying energy. For power transmission to the respective transfer mechanism 3 or 4, a control device 37 according to FIGS. 7 to 11 is provided. If the vehicle includes only one transfer mechanism the power transmission has to be suitably modified.

The vehicle is placed before a loading and unloading station 6 as the destination to which an object to be transported, such as a container 7 for example, is to be transferred or from which it is to be removed.

Particularly suitable containers serve for receiving substrates (semiconductor wafers, reticles and templates) or other flat objects with a lateral opening, by which the container 7 can be coupled to the loading and unloading station 6. The transfer of the container 7 to a receiving element 8 takes place with the aid of one of the transfer mechanisms 3, 4. In the present case, it is the transfer mechanism 4, which is already in a partially extended state. The other transfer mechanism 3, on the other hand, is retracted and is in its starting position.

For oriented setting down, in the bottom of the container 7 and in the receiving element 8 aligning elements shaped to fit one another, in the form of grooves (not represented) and engaging pins, are provided in a three-point formation.

The container 7, shown only in a very simplified form in FIG. 1, is structurally designed in such a way that the load-bearing parts of the transfer mechanism are not hindered in their horizontal movement. This concerns both the movement of the transfer mechanism 4 after setting down the container 7 and the functional sequence for its return transport from the receiving element 8 to the vehicle.

It goes without saying that the destination is not restricted to the loading and unloading station 6 shown in this exemplary embodiment, but may also comprise other locations within the range of action of the vehicle.

The structural design and operating principle of an aligning and coupling device provided for the vehicle but not shown in FIG. 1 is to be described in more detail with reference to FIGS. 2 to 4.

Figure 2:
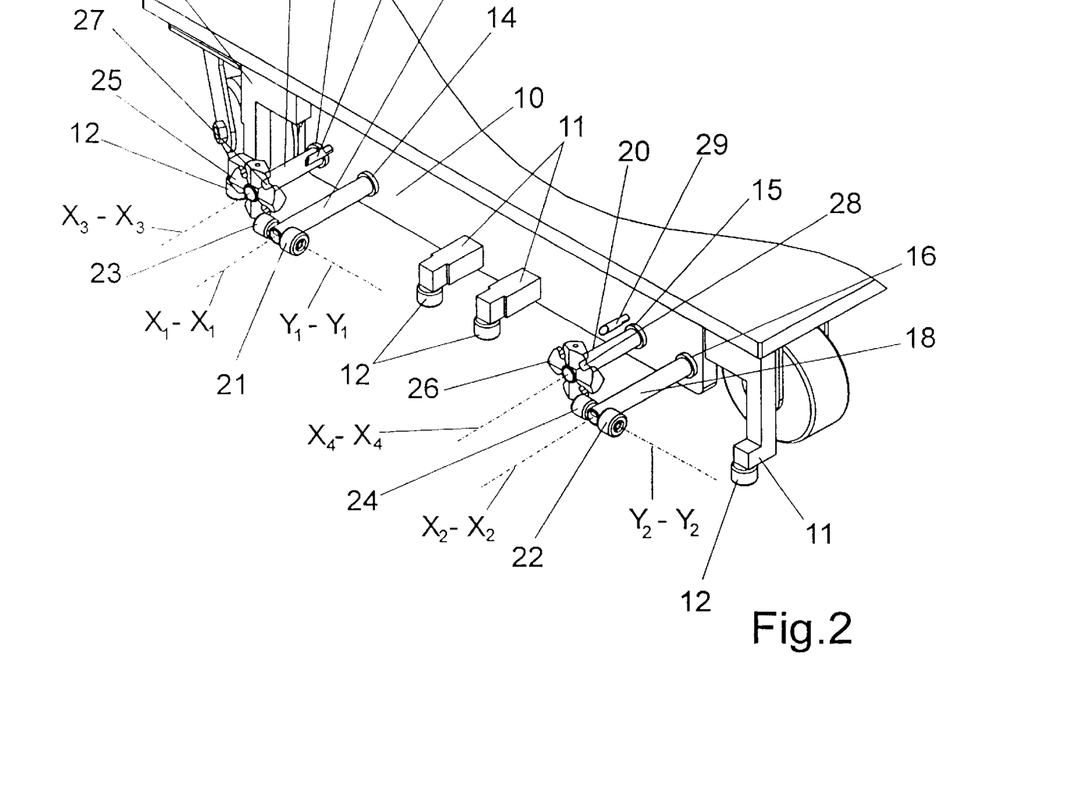
FIG. 2 shows a coupling mechanism provided on the vehicle.

According to FIG. 2, the aligning and coupling device includes a coupling mechanism, which is fitted in the lower section of the vehicle and faces the destination. On a baseplate 9 and on a carrier rail 10 there are provided fixed roller carriers 11 for receiving guide rollers 12, which fix the minimum distance of the vehicle from a coupling interface present at the destination. Shafts 17, 18, which can rotate about their longitudinal axes $X_1$–$X_1$, $X_2$–$X_2$, and rotatable positioning and locking shafts 19, 20 are led out through bearing bushings 13, 14, 15, 16 in the carrier rail 10 and carry at their ends lying outside the vehicle two types of elements with which the vehicle can be coupled at the coupling interface. In addition to the rotational movement, the shafts 17, 18, 19, 20 can also execute a linear movement along their longitudinal axes $X_1$–$X_1$, $X_2$–$X_2$, $X_3$–$X_3$, $X_4$–$X_4$.

The paired design of coupling elements ensures the alignment of two transfer mechanisms with respect to the destination. If the vehicle contains only one transfer mechanism only a single design of coupling elements is required. A first type of coupling elements comprises pairs of rollers each with a larger docking roller 21, 22 and a smaller docking roller 23, 24, the axes of rotation of which $Y_1$–$Y_1$, $Y_2$–$Y_2$ are directed perpendicularly with respect to the longitudinal axes $X_1$–$X_1$, $X_2$–$X_2$ and which enclose the shafts 17, 18 between them. A second type of coupling elements comprises star-shaped positioning and coupling wheels 25, 26, the notches 27, 28 of which form the engaging components.

Returning pins 29, which protrude from the carrier rail 10, engage in the notches 27, 28 of the positioning and coupling wheels 25, 26 when there is a rearward movement of the positioning and locking shafts 19, 20 and establish a defined angular position of the positioning and coupling wheels 25, 26, which is assigned to a starting position. For this purpose, the star-shaped components of the positioning and coupling wheels 25, 26 are shaped in a suitable way.

Figure 3:
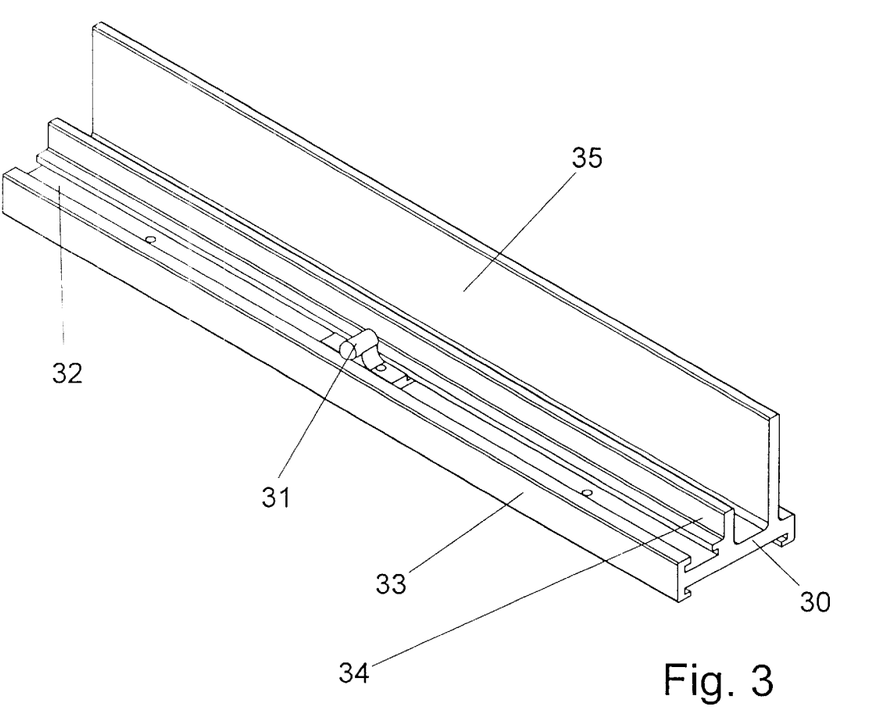
FIG. 3 shows a coupling interface provided at the destination.

According to FIG. 3, the coupling interface includes a guide rail 30 and a coupling bolt 31 as fixed elements. Only the coupling bolt 31 is movable, for adjusting purposes, in a rail 32 for fixing the ultimate coupling position. Once the adjustment has been completed, this element is fixed as well. The rail 32 is directed parallel to the guide rail 30, which is made essentially as a U-profile and has a flange 33 for the guide rollers 12 to bear against.

The guide rail 30, provided in a fixed location at the destination, allows a movement in a first direction along its longitudinal extent and blocks a movement perpendicularly to this direction. As a result, the vehicle, approaching the coupling interface with its coupling mechanism, is aligned parallel to the guide rail 30 as a result of the rolling of the guide rollers 12 on the flange 33. Of the flanges of the guide rail 30, one flange 34, which is facing the vehicle during its approach, is of a smaller height than the other flange 35, although both protrude above the rail 32.

The differences in height between the flanges 34 and 35 ensure reliable docking of the appropriately designed coupling mechanism, in particular of the docking rollers 21, 22, 23, 24, the axes of rotation of which $Y_1$–$Y_1$, $Y_2$–$Y_2$ are, in the uncoupled state, directed parallel to the longitudinal extent of the guide rail 30 and parallel to the plane of movement of the vehicle.

Once the guide rollers 12 are bearing against the flange 33, the shafts 17, 18 are extended until the docking rollers 21, 22, 23, 24 butt against the flanges 35.

A 90° rotation of the shafts 17, 18 about their longitudinal axes $X_1$–$X_1$, $X_2$–$X_2$ causes the small rollers 23 and 24 to be placed between the two flanges 34 and 35 of the guide rail 30. The vehicle can then be moved in the direction of the longitudinal extent of the guide rail 30 and is fixed in the direction perpendicular thereto. For docking, the working steps described are executed essentially in the reverse order.

The ultimate coupling position, in which one of the transfer mechanisms 3 or 4 is aligned with respect to the destination, is assumed by one of the positioning and coupling wheels 25 or 26 being brought into engagement with the coupling bolt 31. FIGS. 4A–4C illustrate this procedure for the positioning and coupling wheel 25, which, positioned by means of the flange 34, initially assumes the angular position of the starting position. During the movement of the vehicle along the guide rail 30, when it reaches the ultimate coupling position, the positioning and coupling wheel 25 finds the coupling bolt 31 and places itself around the latter with one of the notches 27 by a 45° rotation.

Figure 4A:
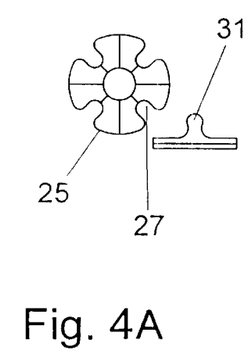
FIGS. 4A, 4B and 4C show the establishment of the engagement of a movable positioning and coupling wheel with a fixed coupling bolt for assuming an ultimate coupling position.
Figure 4B:
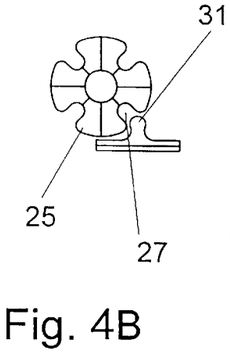
Figure 4C:
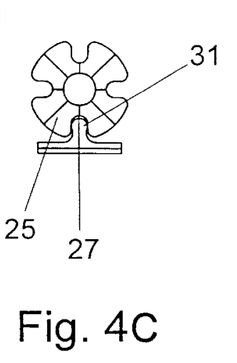

The different angular positions of the positioning and coupling wheel 25 in the uncoupled state FIGS. 4A and 4B and in the coupled state FIG. 4C are used for signal formation as changes in state of the movable elements.

Figure 5:
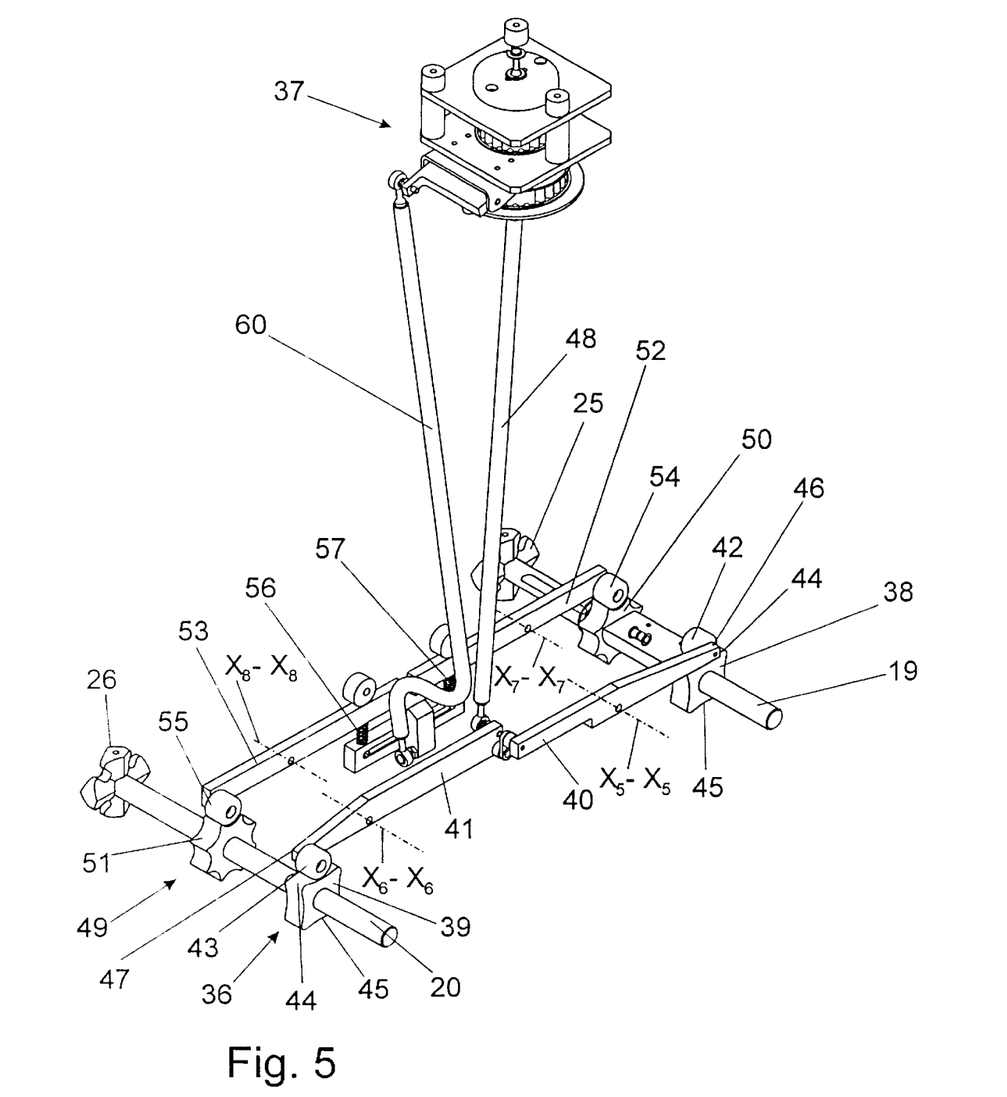
FIG. 5 shows the linking of a signal generator for generating status signals on the coupling state and an immobilizer with a control device.

The angular positions assumed by the positioning and coupling wheels 25 and 26 are recorded by a signal generator 36, included in FIG. 5, to distinguish between the uncoupled state and the coupled state, and are transformed in such a way that it is also possible to distinguish between the two positioning and coupling wheels 25 and 26. Each of these positioning and coupling wheels 25, 26 is assigned to one of the transfer mechanisms 3, 4 via a control device 37, the signal emitted comprising complete information on the coupling state and the position of the coupling. The signal fed to the control device 37 initiates a transmission of the drive power from the drive element 5 to the coupled transfer mechanism 3 or 4.

For this purpose, the signal generator 36 is designed in such a way that the positioning and locking shafts 19, 20 include cam elements 38, 39, on which rotatably fastened signalling rollers 42, 43 rest at the ends of signalling levers 40, 41. Of the cam elements 38, 39, alternately provided raising portions 44 and lowering portions 45 for the signalling rollers 42, 43 correlate with the angular position of the respective positioning and coupling wheel 25, 26. Axes of rotation $X_5$–$X_5$, $X_6$–$X_6$ at the signalling levers 40, 41 are situated in such a way that the ratios of the lever arms of the two signalling levers 40, 41 differ. While the lever arms on the signalling lever 40 are approximately the same in the present example, the signalling lever 41 has a much shorter lever arm on the side of its signalling roller 43 than on its other side. Therefore, changes in the vertical position of the signalling rollers 42, 43 bring about same deflections at the free lever arm ends 46, 47, but transmit different deflections to the control device 37 through a first control rod 48.

The signal generator 36 is designed in such a way that three different signals can be fed to the control device 37. A first signal characterizes a state in which the vehicle has not accomplished a coupling with either of the transfer mechanisms 3, 4 at the destination. In this state, the positioning and coupling wheels 25, 26 assume the angular position represented in FIG. 5, assigned to the starting position. Both signalling rollers 42, 43 are resting on the lowering portions 45 of the cam elements 38, 39, whereby the free lever arm ends 46, 47 stay in their lower position and raise the first control rod 48 the most. If a coupling with one of the positioning and coupling wheels 25, 26 then takes place, the respective wheel is turned through 45° and one of the raising portions 45 of the cam element 38 or 39 raises the signalling roller 42 or 43. If the positioning and coupling wheel 25 comes into action for the coupling, the first control rod 48 will be lowered downward by a smaller amount than in the case of the positioning and coupling wheel 26, due to the difference which exists between the lever arm ratios of the signalling levers 40, 41. Of course, it is possible to generate electrical signals in a suitable manner instead of mechanical signals.

Figure 6:
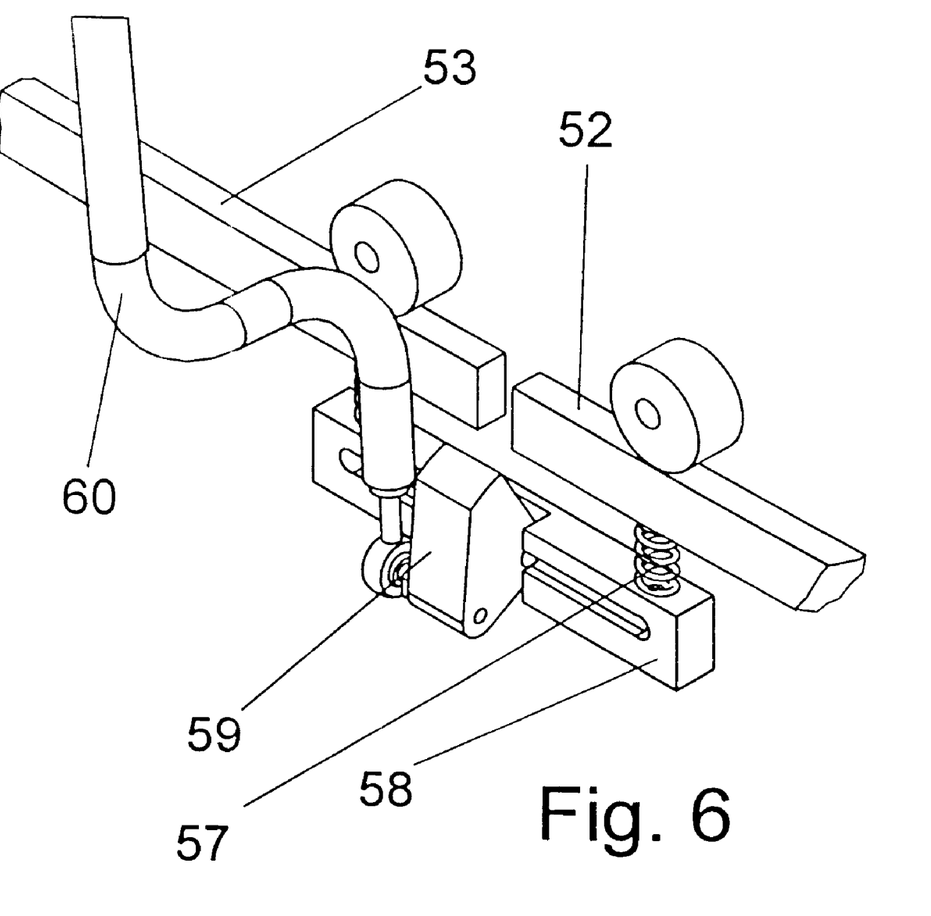
FIG. 6 shows parts of an immobilizer for preventing and enabling the moving of the object away from the destination.
Figure 7:
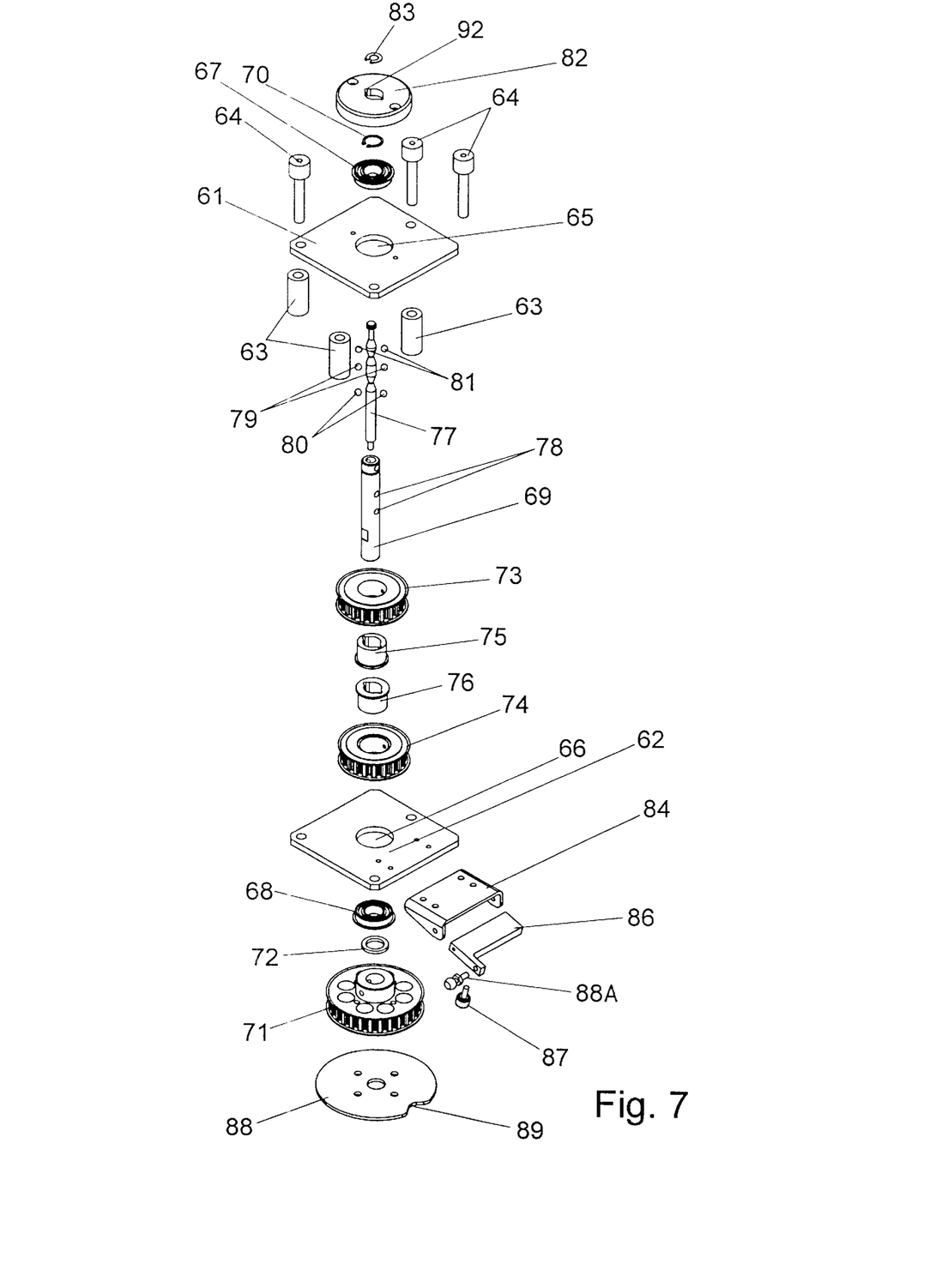
FIG. 7 shows the control device in an exploded representation.

In addition to the signal generator 36 represented in FIG. 5, the coupling mechanism also includes an immobilizer 49, which prevents or enables a moving away of the vehicle from the destination on the basis of a signal made available on the operating state of the transfer mechanisms 3, 4. For this purpose, the positioning and locking shafts 19, 20 include blocking wheels 50, 51, on which there rest, with the force of springs 56, 57, locking rollers 54, 55 which are rotatably fastened to locking levers 52, 53. During the rotation of one of the positioning and coupling wheels 25 or 26 about the coupling bolt 31, a detent force has to be overcome, which facilitates the locating of the coupling bolt 31 and the recognition of the ultimate coupling position. The upward and downward movement of the locking levers 52, 53, caused by the rotation of the blocking wheels 50, 51 can, of course, be controlled by various forms of the blocking wheels 50, 51. The locking levers 52, 53, adjustable about the axes of rotation $X_7$–$X_7$, $X_8$–$X_8$ are suitable, when in an arrested position, for preventing a rotation of the positioning and locking shafts 19, 20, due to the resting of the locking rollers 54, 55 on the blocking wheels 50, 51, and consequently for preventing a movement of the vehicle away from the ultimate coupling position. Provided for this purpose is a blocking element 59, which is rotatably mounted in a mount 58 and on which a vertically displaceable second control rod 60 acts. In its upper position, the second control rod 60 turns the blocking element 59 under the locking levers 52, 53 and prevents their movement. In the lower position, the movement is enabled. From the second control rod 60 there is, according to FIG. 5, a connection to the control device 37, from where the signal on the operating state of the transfer mechanisms 3, 4 is sent.

The control device 37, the structural design and operating principle of which are illustrated by FIGS. 7 to 11, includes as carrying elements an upper carrier plate 61 and a lower carrier plate 62, the distance between which is determined by spacers 63 and which are held together by connecting elements 64. Centrally made bores 65, 66 in the carrier plates 61, 62 serve for receiving bearings 67, 68, which allow an internally hollow drive shaft 69 to rotate freely, a restraining ring 70 preventing the drive shaft 69 from falling out. A drive roller 71, to which a power transmission takes place from the drive element 5 through a suitable power-transmission element (not shown), is in fixed connection with the drive shaft 69 and passes on to the latter the power supplied to it. A spacer 72 prevents contact with the fixed part of the bearing 68. The free space between the carrier plates 61, 62 serves for receiving a first running roller 73 and a second running roller 74, which are displaceable on the drive shaft 69 by being fastened on bearing bushes 75, 76. For the transmission of the torque from the drive shaft 69 to the running rollers 73, 74, and consequently to the transfer mechanisms 3, 4, there is provided a control shaft 77, which is displaceable in the cavity of the drive shaft 69 and, by virtue of its shaping and two different positions, is suitable for pressing spherical driving elements 79, 80, contained in holes 78 in the wall of the drive shaft 69, into recesses of the bearing bushes 75, 76 of the running roller 73 or 74 to be driven along. A third position of the control shaft 77 is provided for the purpose of pressing further driving elements 81 partially out of the drive shaft 69 into an interlocking plate 82, rigidly connected to the carrier plate 61, so that the drive shaft 69 is blocked. The three positions of the control shaft 77 correlate with the settings of the signal generator 36, for which purpose the first control rod 48 is in connection with the control shaft 77. The control shaft 77 is also secured by a restraining ring 83, here against falling out from the drive shaft 69.

In addition to the controlling of the power transmission from a drive to two mechanisms, to be selected separately from each other, on the basis of an external signal, the control device 37 also has the task of itself providing a signal, which characterizes the operating state of the two mechanisms. There is also an alternative possibility to generate electronical signals. The signal is intended for the actuation of the immobilizer 49. If one of the two mechanisms is in operation, the vehicle must not be moved away from the destination. Only when both mechanisms are not in operation, i.e. when no container transport is taking place, may the vehicle be moved to another destination.

Figure 8:
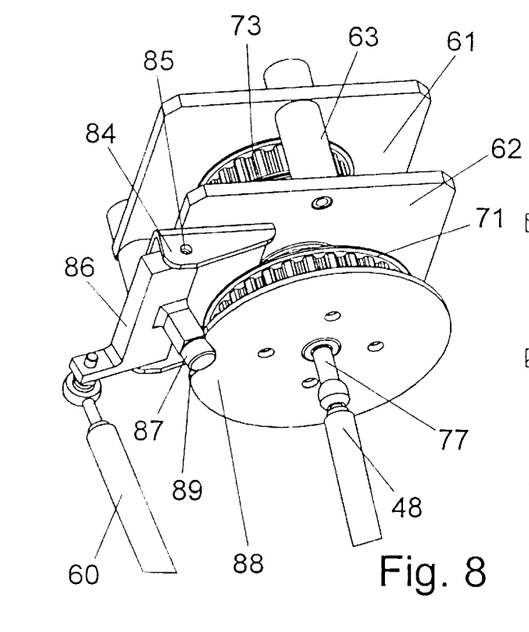
FIG. 8 shows the control device in a perspective representation from below.

For this purpose, according to FIG. 8 there is fastened on the lower carrier plate 62 a mount 84, which carries an interlocking lever 86 in a joint 85. While an interlocking roller 87 is rotatably secured to one end of the lever, the other end of the lever has a pin 88A, on which the second control rod 60 acts. Furthermore, the drive roller 71 is fixedly connected to an interlocking flange 88, which includes a locking notch 89 in the region of its edge. When neither of the mechanisms 3, 4 are being operated, the interlocking roller 87 lies in the locking notch 89. The second control rod 60 is located in its lower position, in which the movement of the immobilizer 49 is out of operation. If the drive roller 71 is set in motion, to actuate one of the drive mechanisms 3, 4, the interlocking roller 87 is lifted out of the locking notch 89, whereby the other end of the interlocking lever 86 is raised, with the second control rod 60 fastened thereto. As a consequence, the immobilizer 49 blocks the movement of the positioning and locking wheels 19, 20, as already described.

Figure 9:
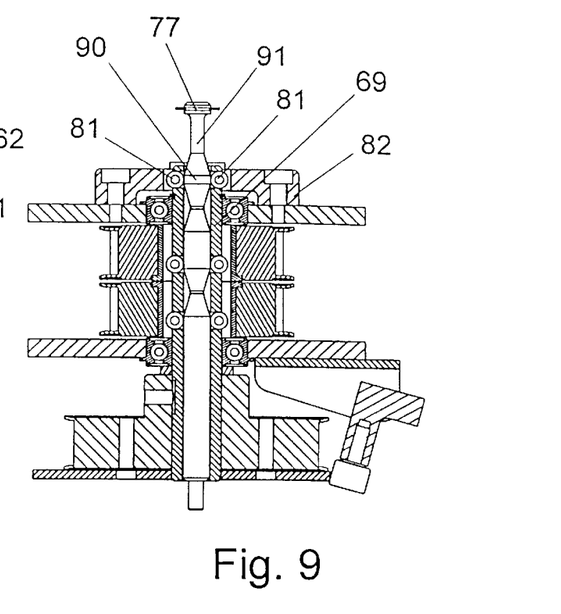
FIG. 9 shows a section through the control device in a state in which there is no power transmission to one of the rollers.
Figure 10:
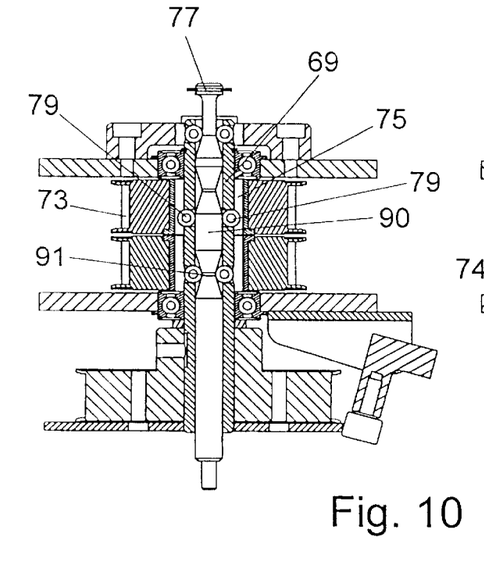
FIG. 10 shows a section through the control device in a state in which there is power transmission to the upper roller.
Figure 11:
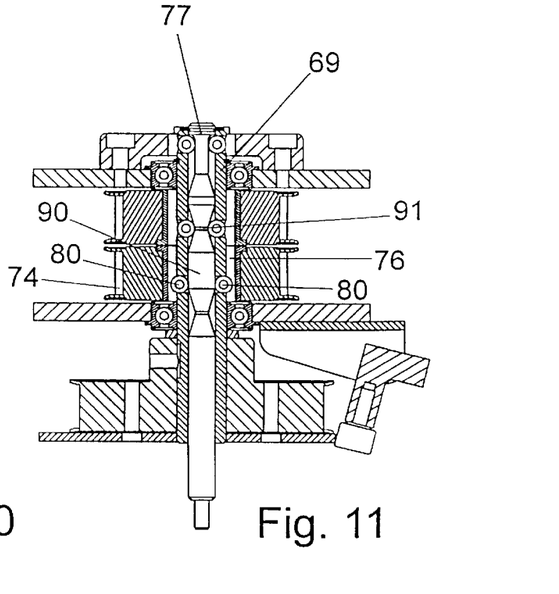
FIG. 11 shows a section through the control device in a state in which there is power transmission to the lower roller.

The torque transmission in the control device 37 is explained by FIGS. 9 to 11. If the vehicle is not connected to the coupling interface present at the destination, operation of the transfer mechanisms 3, 4 is to be prevented. The control rod 48 and the control shaft 77, connected to the latter, assume their uppermost positions, which corresponds to the representations in FIGS. 5 and 9. The profile made in the control shaft 77 includes alternately regions of larger shaft diameter 90 and regions of smaller shaft diameter 91, of which the one regions 90 press the driving elements 81 into recesses 92 (FIG. 7) provided in the interlocking plate 82 and block the drive shaft 69.

In FIG. 10, the control shaft 77 is in a central position, which is brought about by the positioning and coupling wheel 25 being active for the coupling and by the control rod 48 being adjusted vertically by the signalling lever 40. The driving elements 79 are pressed out of the drive shaft 69 into recesses in the bushing 75, whereby a transmission of the torques to the running roller 73 is ensured.

In FIG. 11, the driving elements 80 are in connection with the bushing 76, so that a transmission of the torques to the running roller 74 can take place. The present, lower position of the control shaft 77 is a consequence of the coupling of the positioning and coupling wheel 26 to the coupling interface and is produced by the adjustment of the control rod 48 via the control lever 41.

While the foregoing description and drawings represent the present invention, it will be obvious to those skilled in the art that various changes may be made therein without departing from the true spirit and scope of the present invention.

What is claimed is:

1. A device for aligning and coupling at least a partial region of a movable object to a destination, comprising:

interengaging fixed and movable coupling elements, said fixed coupling elements being provided in a fixed location at the destination, and said movable coupling elements being provided on the object;

a guiding device and means for fixing at least one ultimate coupling position being included in said fixed coupling elements, said means for fixing at least one ultimate coupling position being included in said guiding device, said guiding device allowing a movement of the object in a first direction for reaching the ultimate coupling position which is determined by said means for fixing within said guiding device and blocking a movement perpendicularly with respect to this direction;

said movable coupling elements being separated into first elements for engagement in said guiding device and second elements for engagement with said means for fixing at least one ultimate coupling position; and means for generating first status signals on the state of the coupling of at least a partial region of the movable object to the destination, said means for generating first status signals being included in said second elements.

2. The device according to claim 1, wherein the movable object includes at least one mechanism for the transfer of an item between the object and the destination, the operation of which mechanism being associated with the state of the coupling.

3. The device according to claim 2, wherein said means for generating first status signals includes at least a first rotatable shaft with markings for angular positions of the shaft differing from one another, in the coupled state and uncoupled state and sensing elements for detecting the markings, said sensing elements passing the sensed angular position on to a device for signal transmission as said first status signal.

4. The device according to claim 3, wherein said means for generating first status signals includes a pair of first rotatable shafts, the generated first status signals of each shaft differing from one another, and said device for signal transmission being in connection with a receiver on a control device for a transmission of a drive power, in which the transmitted status signal allows a transmission of the drive power or prevents the power transmission.

5. The device according to claim 4, wherein said second elements includes means for preventing and enabling the moving away of the object from the destination and wherein second status signals on the operating state of the at least one mechanism being provided for the control of said means for preventing and enabling the moving away of the object from the destination which is equipped with a receiving device for the second status signals.

6. The device according to claim 5, wherein said means for preventing and enabling the moving away of the object from the destination include an immobilizer, with which said first shaft can be blocked in its rotational movement on the basis of the second status signals.

7. The device according to claim 6, wherein said immobilizer is provided in the form of a blocking wheel which is fastened on said first shaft and on which there rests, with the force of a spring, a locking roller which is rotatably fastened to a locking lever, the locking lever assuming an arrested state during blocking.

8. The device according to claim 7, wherein said first elements for engagement in said guiding device including at least a second rotatable shaft with a pair of rollers at their end facing the guiding device, the rollers of which enclose the second rotatable shaft between them and have axes of rotation directed perpendicularly with respect to the shaft axis, the engagement being associated with a linear movement, directed at said guiding device, and a subsequent rotational movement of said second rotatable shaft, so that subsequently one roller of the pair of rollers is guided in said guiding device.

9. The device according to claim 8, wherein said means for fixing at least one ultimate coupling position comprises a coupling bolt, which can be fixed in an adjusted manner along said guiding device and around which a coupling region, fastened to the end region of said first rotatable shaft, places itself with a notch during coupling by rotation of said first shaft, which results in an angular position of said first shaft which is different from the uncoupled state.

10. The device according to claim 1, wherein said first elements for engagement in said guiding device include a rotatable shaft with a pair of rollers at their end facing the guiding device, the rollers of which enclose the rotatable shaft between them and have axes of rotation directed perpendicularly with respect to the shaft axis, the engagement being associated with a linear movement, directed at said guiding device, and a subsequent rotational movement of said rotatable shaft, so that subsequently one roller of the pair of rollers is guided in said guiding device.

11. The device according to claim 1, wherein said guiding device is adapted to block the movement of the object in a direction perpendicular to said first direction only after said first elements of said movable coupling elements engage in said guiding device.

* * * * *